US008680748B2

(12) United States Patent
Cappello et al.

(10) Patent No.: US 8,680,748 B2
(45) Date of Patent: Mar. 25, 2014

(54) APPARATUS FOR USE WITH AN ACOUSTIC DRUM TO PRODUCE ELECTRICAL SIGNALS WHILE MUTING THE SOUND OF THE ACOUSTIC DRUM

(71) Applicants: Joseph J. Cappello, Woodbury, CT (US); Nigel Robinson, Bournemouth (GB)

(72) Inventors: Joseph J. Cappello, Woodbury, CT (US); Nigel Robinson, Bournemouth (GB)

(*) Notice: Subject to any disclaimer, the term of this patent is extended or adjusted under 35 U.S.C. 154(b) by 0 days.

(21) Appl. No.: 13/745,777

(22) Filed: Jan. 19, 2013

(65) Prior Publication Data
US 2013/0152770 A1  Jun. 20, 2013

Related U.S. Application Data

(62) Division of application No. 12/354,069, filed on Jan. 15, 2009, now Pat. No. 8,358,050.

(60) Provisional application No. 61/021,423, filed on Jan. 16, 2008.

(51) Int. Cl.
| | | |
|---|---|---|
| *H01L 41/113* | (2006.01) | |
| *G10H 3/14* | (2006.01) | |
| *G10D 13/02* | (2006.01) | |

(52) U.S. Cl.
CPC ............ *H01L 41/1132* (2013.01); *G10H 3/143* (2013.01); *G10D 13/022* (2013.01); *G10D 13/024* (2013.01)
USPC .......................................................... 310/338

(58) Field of Classification Search
CPC .. H01L 41/1132; G10H 3/143; G10D 13/022; G10D 13/024
USPC .......................................................... 310/338
See application file for complete search history.

(56) References Cited

U.S. PATENT DOCUMENTS

| | | | | |
|---|---|---|---|---|
| 5,293,000 A | * | 3/1994 | Adinolfi | 84/730 |
| 2009/0000464 A1 | * | 1/2009 | Mishima | 84/724 |

* cited by examiner

*Primary Examiner* — Derek Rosenau
(74) *Attorney, Agent, or Firm* — Raymond A. Nuzzo

(57) ABSTRACT

An electronic percussion apparatus for use with an acoustic drum. The apparatus has a base layer of material having a first side for contacting a drum head of an acoustic drum, and an opposite, second side. The apparatus has a top layer of material joined to the base layer of material. A percussion detector is between the top and base layers. The percussion detector generates electrical signals in response to percussion impacts on the top layer. The top and bottom layers each have a thickness that acoustically isolates the drum head from percussion impacts on the top layer, wherein when the electronic percussion apparatus is placed on a drumhead of an acoustic drum and percussion impacts occur on the top layer, the drumhead is acoustically isolated from the percussion impacts and the percussion detector generates electrical signals in response to the percussion impacts on the top layer.

8 Claims, 7 Drawing Sheets

APPARATUS FOR USE WITH AN ACOUSTIC DRUM TO PRODUCE ELECTRICAL SIGNALS WHILE MUTING THE SOUND OF THE ACOUSTIC DRUM

CROSS-REFERENCE TO RELATED APPLICATIONS

This application is a divisional of U.S. application Ser. No. 12/354,069, filed Jan. 15, 2009, now U.S. Pat. No. 8,358,050, which claims the benefit of U.S. provisional application No. 61/021,423, filed Jan. 16, 2008. The disclosures of application Ser. Nos. 12/354,069 and 61/021,423 are hereby incorporated by reference.

TECHNICAL FIELD

The present invention generally relates to an apparatus for use with an acoustic drum to produce electrical signals while muting the sound of the acoustic drum.

BACKGROUND ART

Percussion instruments are known in the art and include such musical instruments as drums. Drums typically fall into two categories: (1) acoustic, and (2) electronic.

DISCLOSURE OF THE INVENTION

The present invention is directed to, in one aspect, an apparatus for use with an acoustic drum to produce electrical signals while substantially muting the sound of the acoustic drum. The apparatus comprises a base layer of material having a first side for contacting a drum head and an opposite second side, a piezoelectric sensor positioned on the opposite second side of the base layer of material, a device in electrical signal communication with the piezoelectric sensor to provide accessibility to the electrical signals produced by the piezoelectric sensor, and a top layer of material joined to the base layer of material so that said piezoelectric sensor is sandwiched between said top and base layers of material.

In another aspect, the present invention is directed to an apparatus for use with an acoustic drum to produce electrical signals while substantially muting the sound of the acoustic drum, comprising a base layer of material having a first side for contacting a drum head and an opposite, second side, a piezoelectric sensor positioned on the opposite, second side of the base layer of material, and an electrical connector fixture positioned on the opposite, second side of the base layer of material. The electrical connector fixture comprises an electrical connector in electrical signal communication with the piezoelectric sensor. The apparatus further comprises a top layer of material having an opening sized to receive the electrical connector fixture. The top layer of material is joined to the base layer of material so that the piezoelectric sensor is sandwiched between the top and base layers of material and a portion of the electrical connector fixture protrudes through the opening in the top layer of material so that the electrical connector is accessible.

In a further aspect, the present invention is directed to an apparatus for use with an acoustic drum to produce electrical signals while substantially muting the sound of the acoustic drum, comprising a base layer of material having a first side for contacting a drum head and an opposite second side, a layer of vibration-isolating material joined to the opposite second side of the base layer of material, a piezoelectric sensor positioned on the layer of vibration-isolating material, and an electrical connector fixture joined to the layer of vibration-isolating material. The electrical connector fixture comprises an electrical connector that is in electrical signal communication with the piezoelectric sensor. The apparatus further comprises a top layer of material that has an opening sized to receive the electrical connector fixture. The top layer of material is joined to the layer of vibration-isolating material and the periphery of the base layer of material so that the piezoelectric sensor is sandwiched between the top layer of material and the layer of vibration-isolating material and a portion of the electrical connector fixture protrudes through the opening in the top layer of material so that the electrical connector is accessible.

In yet another aspect, the present invention is directed to a pad for use on a drum head of an acoustic drum, comprising a pad fabricated from a resilient material wherein the pad has a bottom side for contacting a drum head, a piezoelectric sensor embedded within the pad, and a device in electrical signal communication with the piezoelectric sensor to provide accessibility to the electrical signals produced by the piezoelectric sensor.

DESCRIPTION OF THE DRAWINGS

The foregoing features of the present invention will become more readily apparent and may be understood by referring to the following detailed description of an illustrative embodiment of the present invention, taken in conjunction with the accompanying drawings, in which.

BEST MODE FOR CARRYING OUT THE INVENTION

Figure 1:
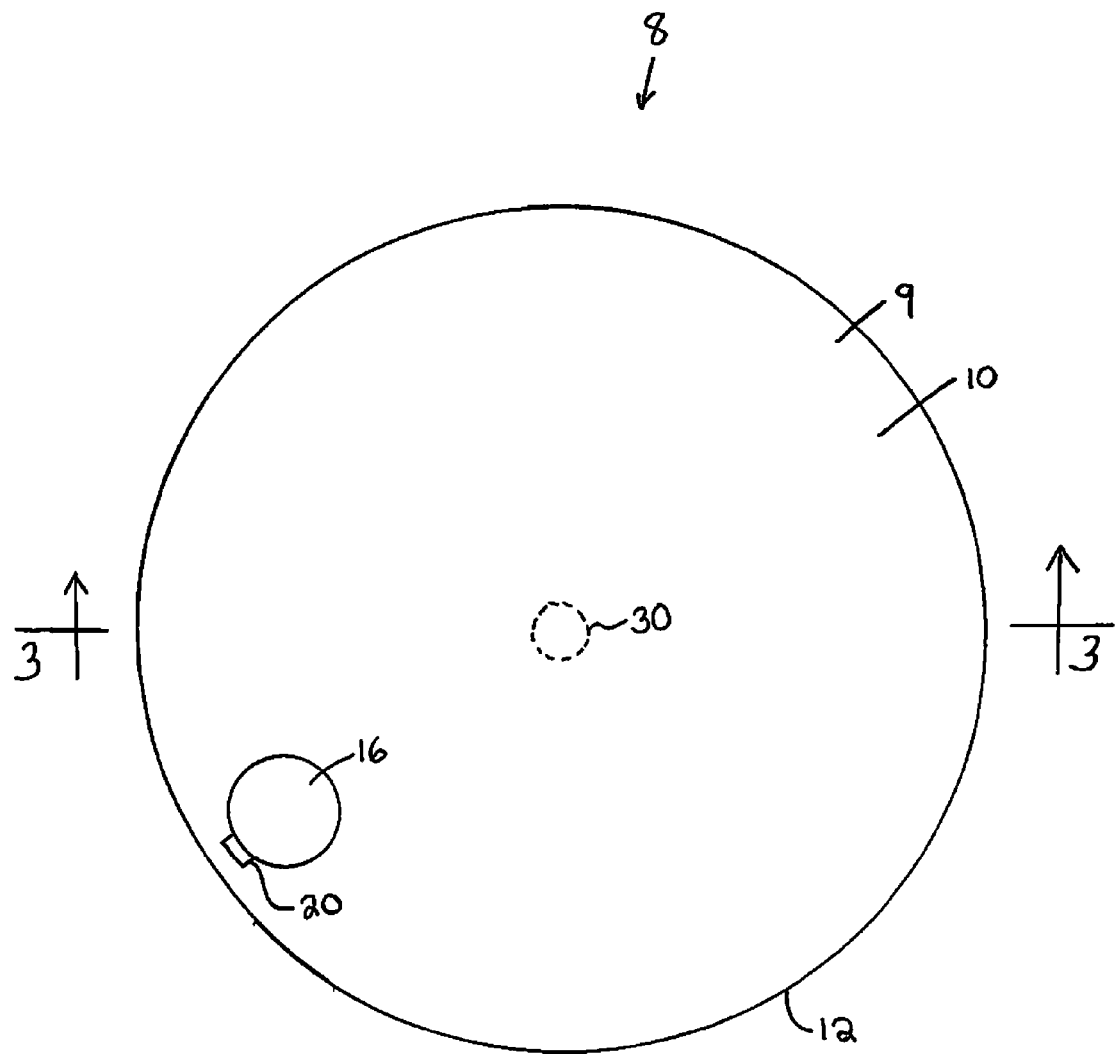
FIG. 1 is a top plan view of an apparatus for use with an acoustic drum to produce electrical signals while muting the sound of the acoustic drum in accordance with one embodiment of the present invention.
Figure 2:
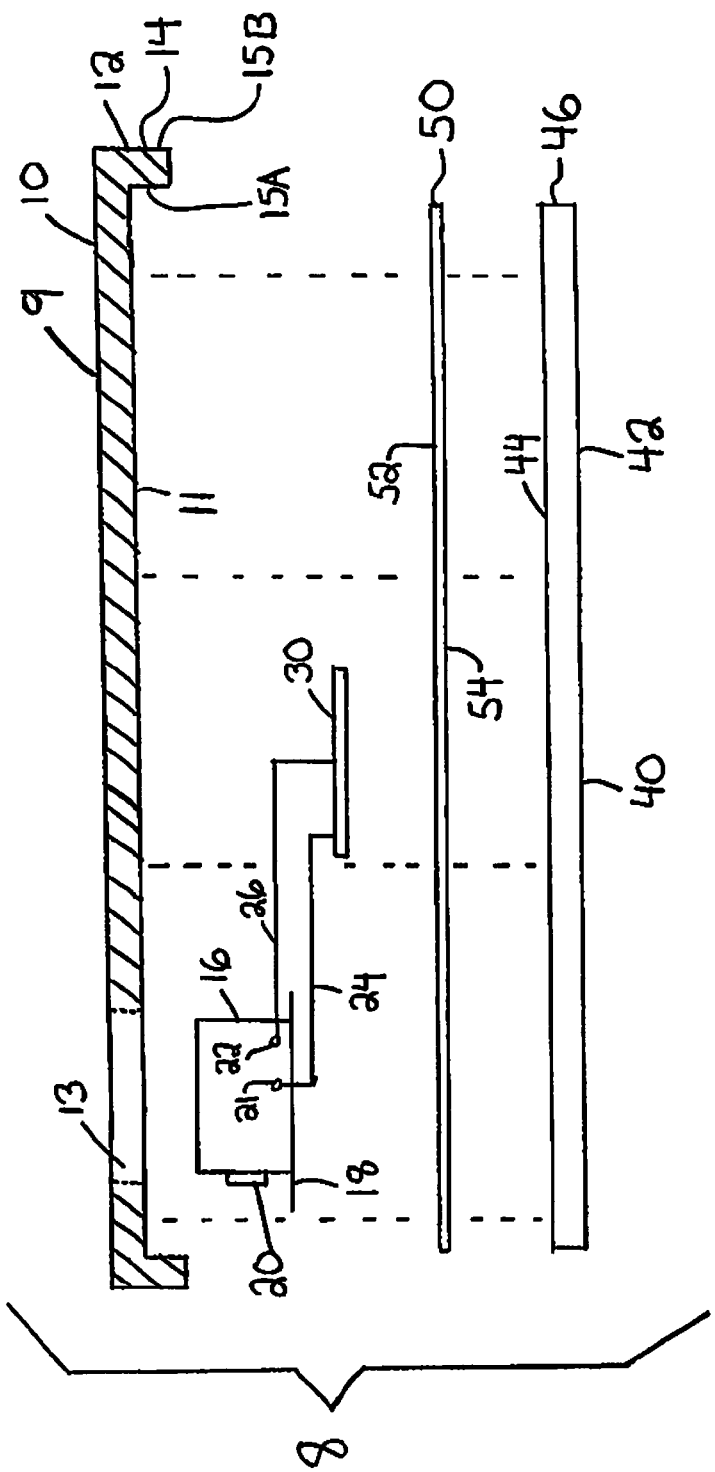
FIG. 2 is an exploded view, partially in cross-section, of the apparatus of FIG. 1.

Referring to FIGS. 1, 2, 3 and 4, there is shown apparatus 8 in accordance with one embodiment of the present invention. In a preferred embodiment, apparatus 8 has a generally circular shape. However, apparatus 8 can be configured to have other shapes as well, e.g. square, rectangular, triangular, etc. Apparatus 8 generally comprises top layer of material 9 which has top side 10, bottom side 11 and peripheral end portion 12. Top layer of material 9 also includes opening 13 that extends through the entire thickness of top layer of material 9. In a preferred embodiment, end portion 12 comprises a flanged portion 14 which comprises inner surface 15A and outer surface 15B. This feature is further explained in the ensuing description. In a preferred embodiment, top layer of material 9 is fabricated from a resilient material. In one embodiment, top layer of material 9 is fabricated from rubber. Any known, suitable process for forming top layer 9 from rubber may be used. When apparatus 8 is being used, a drummer strikes top surface 10 of top layer of material 9 with drum sticks. However, this aspect of the invention is further explained in the ensuing description, Referring to FIGS. 1, 2 and 4, apparatus 8 further comprises connector fixture 16. Connector fixture 16 comprises connector fixture mounting plate 18 and electrical connector 20. In one embodiment, electrical connector 20 is configured as a jack-type connector. However, electrical connector 20 may be configured as any other type of electrical connector suitable for use with electrical signals. In one embodiment, connector fixture 16, except electrical connector 20, is fabricated from ABS plastic. Connector fixture 16 also includes electrical contacts 21 and 22 that are electrically connected to electrical connector 20. Electrical connector 20 is configured to be connected to electrical cables suitable for electrical signals. Apparatus 8 further comprises wires 24 and 26 that are connected to electrical contacts 21 and 22, respectively. As shown in FIG. 2, connector fixture 16 extends through opening 13 in top layer of material 9 so that electrical connector 20 is accessible.

Figure 3:
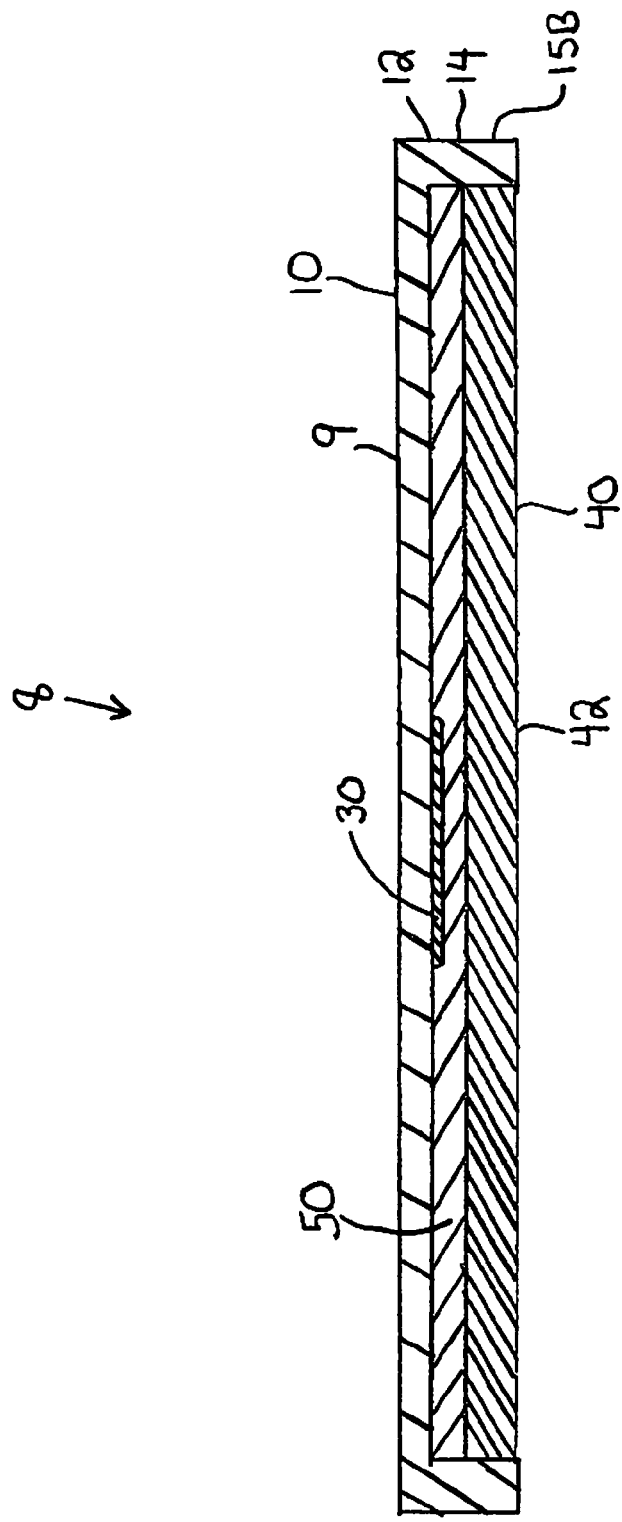
FIG. 3 is a cross-sectional view taken along line 3-3 in FIG. 1.
Figure 4:
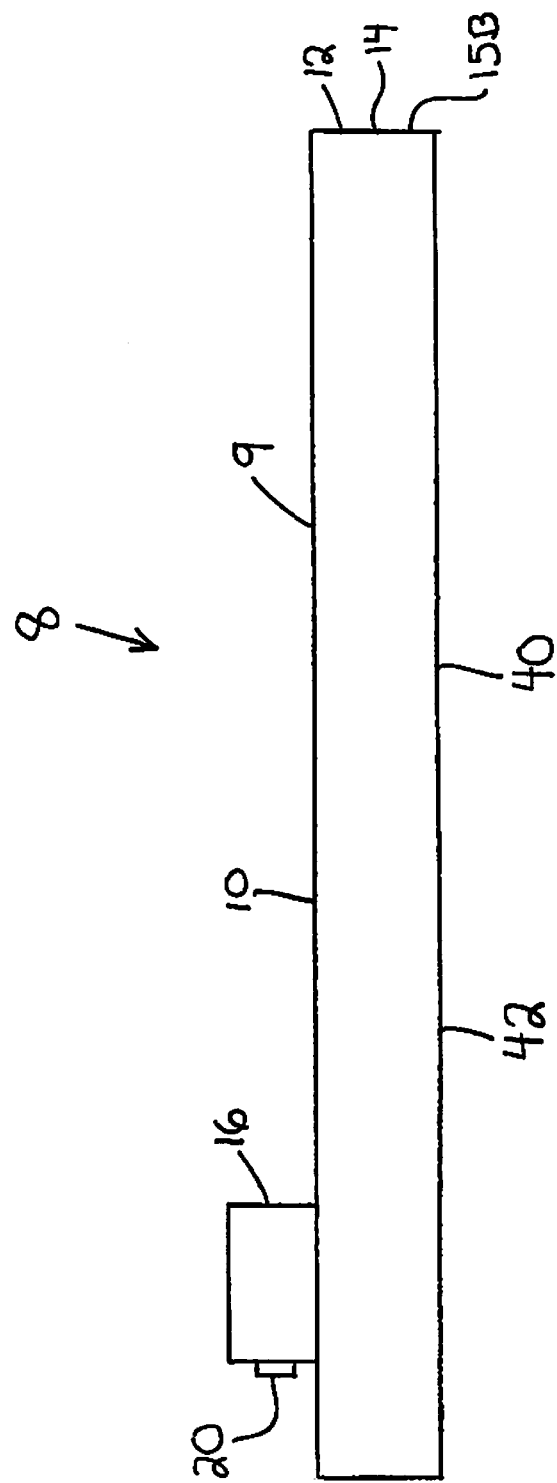
FIG. 4 is a side view of the apparatus of FIG. 1.

Referring to FIGS. 1 and 3, apparatus 8 further comprises piezoelectric sensor 30. Piezoelectric sensor 30 is shown in phantom in FIG. 1. In a preferred embodiment, piezoelectric sensor 30 is configured as a commercially available piezoelectric diaphragm. In one embodiment, the piezoelectric diaphragm is shaped as a disc. Wires 24 and 26 are connected to piezoelectric sensor 30. When the piezoelectric diaphragm is deformed by vibrations, it generates a voltage. Wires 24 and 26 provide this voltage to electrical connector 20. A cable (not shown) can be connected to electrical connector 20 so as to route the aforesaid electrical signals to external equipment or signal processing devices, e.g. analyzers, modulators, synthesizers, amplifiers, sound mixing boards, etc.

Referring to FIGS. 1, 2 and 3, apparatus 8 further comprises bottom layer of material 40 which has bottom side 42. Bottom side 42 sits upon and directly contacts the drum head of a drum. In a preferred embodiment, bottom side 42 has a textured surface to provide a high degree of friction between bottom side 42 and the drum head of a drum in order to prevent apparatus 8 from sliding upon the drum head. Bottom layer 40 further includes top side 44 and perimetrical edge 46. In a preferred embodiment, bottom layer 40 is fabricated from a resilient material such as rubber. Any known and suitable process may be used to fabricate bottom layer 40 from rubber. However, other suitable materials may be used to fabricate bottom layer 40.

Referring to FIGS. 1 and 3, in one embodiment, apparatus 8 further comprises layer of vibration-isolating material 50. Layer 50 has a top side 52 and a bottom side 54. Bottom side 54 is attached to top side 44 of bottom layer 40. The function of layer of vibration-isolating material 50 is to substantially isolate the drum head of the acoustic drum from the impact of the drum sticks upon top surface 10 of top layer of material 9. This will substantially reduce or mute any sounds produced by the acoustic drum as the drum sticks are being played upon top layer 9. This feature is further described in the ensuing description. In a preferred embodiment, layer 50 is fabricated from metal. Examples of suitable metals are steel, aluminum, copper, and brass. However, layer 50 can be fabricated from other suitable materials that exhibit a relatively high degree of vibration-isolation. For example, layer 50 can also be fabricated from a non-metal such as plastic. In one embodiment, bottom side 54 of layer 50 is attached to top side 44 of bottom layer 40 with an adhesive, such as an epoxy. However, other suitable techniques may be used to attach layer 50 to bottom layer 40. In one embodiment, the diameter of layer 50 is substantially the same as the diameter of bottom layer 40. Thus, the perimetrical edge 46 of bottom layer 40 contacts inner wall 15A of flanged portion 14 when apparatus 8 is completely assembled. Thus, layers 9, 40 and 50 are joined together to form a pad.

Referring to FIGS. 1 and 3, piezoelectric sensor 30 is positioned on top side 52 of layer of vibration-isolating material 50. In one embodiment, piezoelectric sensor 30 is joined to top side 52 of layer of vibration-isolating material 50 with an adhesive. However, other suitable bonding techniques may be used to join sensor 30 to layer 50. Connector fixture mounting plate 18 is attached to top side 52 of layer of vibration-isolating material 50. In a preferred embodiment, an adhesive is used to attach fixture mounting plate 18 to layer of vibration-isolating material 50. One example of a suitable adhesive is an epoxy. Top layer 9 is attached to layer of vibration-isolating material 50 and perimetrical edge 46 of bottom layer 40. In one embodiment, an adhesive is used to join top layer 9 to layer of vibration-isolating material 50 and perimetrical edge 46 of bottom layer 40. One suitable adhesive is an epoxy. When top layer of material 9 is attached to layer of vibration-isolating material 50 and the perimetrical edge 46 of bottom layer 40, connector fixture 16 protrudes through opening 13. This configuration allows electrical connector 20 to be accessible.

In one embodiment, top layer 9 and bottom layer 40 are fabricated from rubber, and layer of vibration-isolating material 50 is fabricated from metal, and the overall thickness of apparatus 8 is about ⅜ inch. However, the overall thickness of apparatus 8 may vary depending upon the actual materials used to fabricate apparatus 8. In a preferred embodiment, apparatus 8 is fabricated so that its total weight is between 1.5 lbs and 3.0 lbs. Such a weight prevents movement of apparatus 8 while in use on the drum head, and also provide a high degree of durability.

Figure 5:
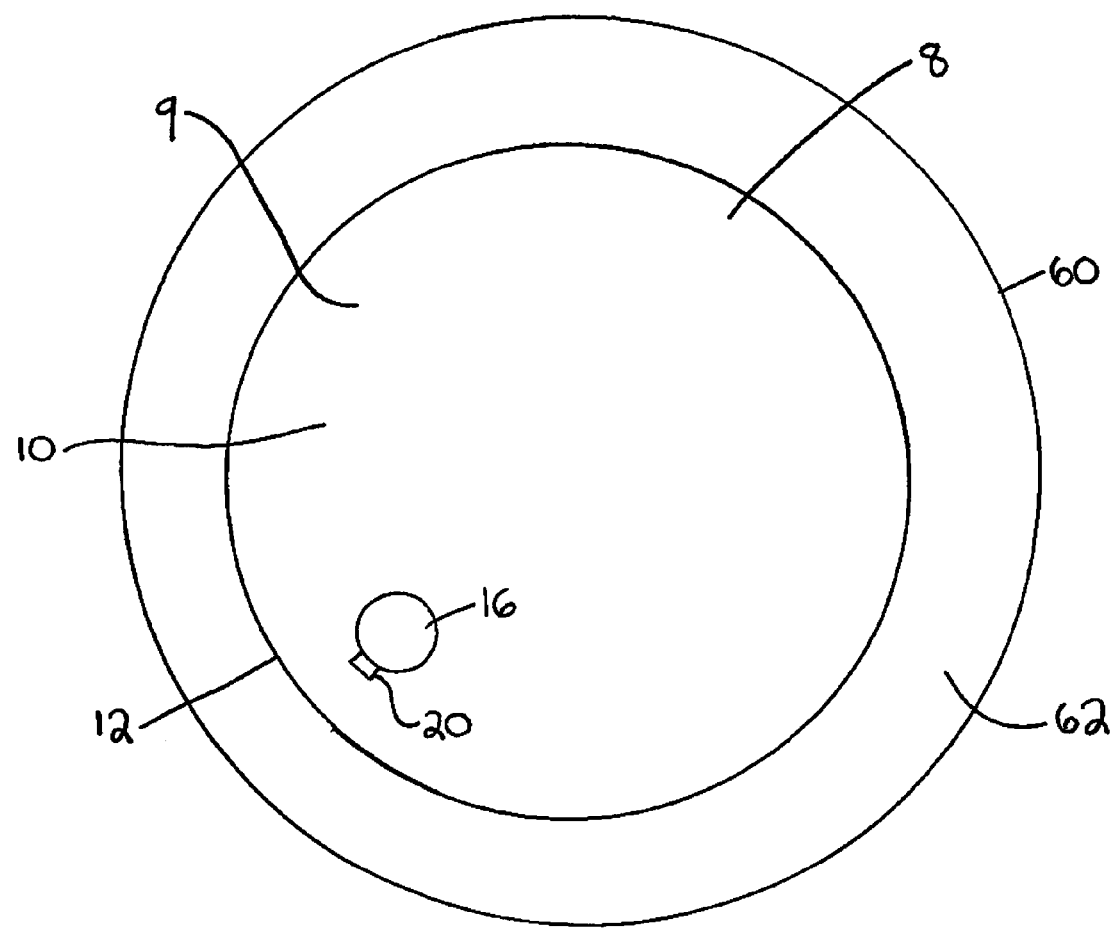
FIG. 5 illustrates the placement of the apparatus of FIG. 1 on a drum head.

Apparatus 8 is configured to be used with acoustic drums. Referring to FIG. 5, acoustic drum 60 has drum head 62. Apparatus 8 is placed on drum head 62. Since, bottom layer 40 is fabricated from rubber, apparatus 8 will not slide upon drum head 62. The musician (i.e. drummer) strikes top surface 10 of top layer of material 9 with his or her drum sticks. The top and bottom layers of material 9 and 40, respectively, and layer of vibration-isolating material 50 cooperate to substantially isolate drum head 60 from the impact of the drum sticks upon top layer 9 thereby substantially reducing or muting sounds produced by the acoustic drum in response to the impact of the drum sticks upon top layer 9. However, the physical contact between the drum sticks and top layer 9 causes the piezoelectric diaphragm (i.e. piezoelectric sensor 30) to generate an electrical signal (i.e. voltage). The electrical signal travels over wires 24 and 26 to electrical connector 20. A cable (not shown) can be connected to electrical connector 20 so as to route the electrical signals generated by piezoelectric sensor 30 to other equipment, such as amplifiers, modulators, synthesizers, signal analyzers and processors, etc. Thus, apparatus 8 converts an acoustic drum into an electronic drum.

The overall size of apparatus 8 may be varied to be used with drum heads of various sizes. Thus, if apparatus 8 is configured to have a generally circular shape, then the diameter of apparatus 8 may be increased or decreased depending upon the diameter of the drum head.

Figure 8:
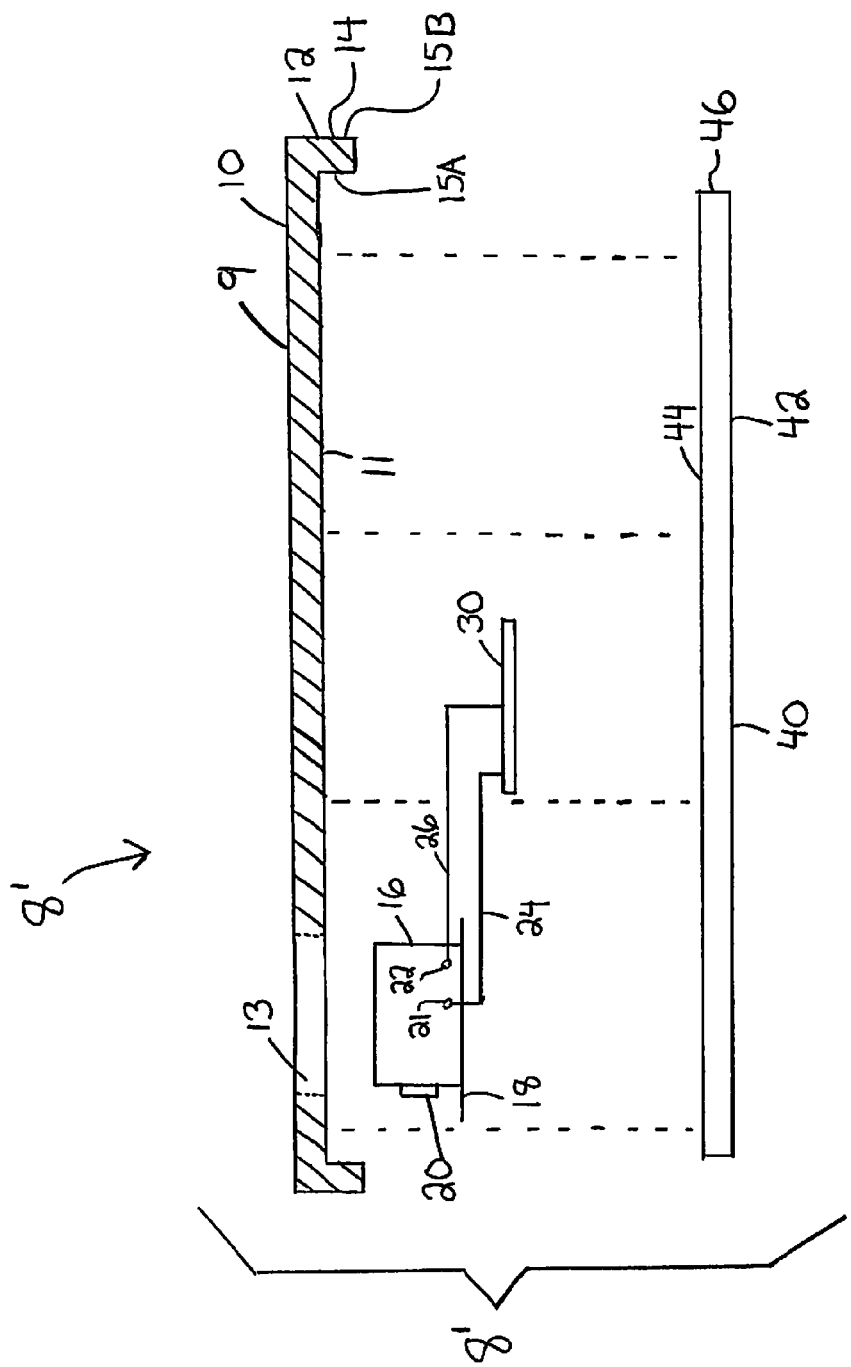
FIG. 8 is an exploded view, partially in cross-section, of an alternate embodiment of the apparatus of FIG. 1.

In an alternate embodiment of the invention, apparatus 8 does not use layer of vibration-isolating material 50. In such an embodiment, top layer 9 is joined to top side 44 and perimetrical edge 46 of bottom layer of material 40, and piezoelectric sensor 30 is sandwiched between top side 44 of bottom layer of material 40 and bottom side 11 of top layer of material 9. In such an embodiment, the thickness of layers 9 and 40 can be increased to achieve a sufficient level of vibration-isolation. Such an embodiment is shown as apparatus 8' in FIG. 8. FIG. 8 is an exploded view of alternate apparatus 8'. In this embodiment, connector fixture mounting plate 18 and piezo-electric sensor 30 are joined or attached to top side 44 of bottom layer of material 40 by any of the techniques or methods described in the foregoing description. Top layer of material 9 is joined or attached to bottom layer of material 40 by any of the techniques or methods described in the foregoing description. As shown in FIG. 8, apparatus 8' does not use any intermediate layers.

Figure 6:
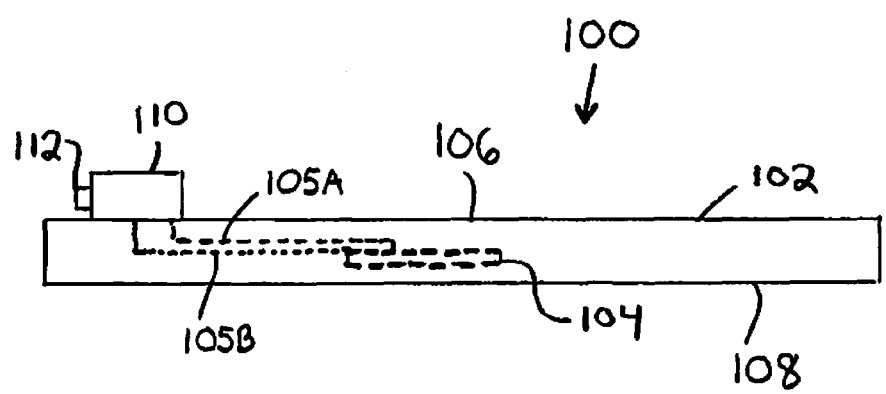
FIG. 6 is a side view of an apparatus for use with an acoustic drum to produce electrical signals while muting the sound of the acoustic drum in accordance with another embodiment of the present invention.

Referring to FIG. 6, there is shown apparatus 100 in accordance with a further embodiment of the present invention. Apparatus 100 comprises a pad of resilient material 102 that has embedded therein a piezoelectric sensor 104 and wires 105A and 105B (shown in phantom). Pad of resilient material 102 has top surface 106 and bottom surface 108. Apparatus 100 also includes electrical connector fixture 110 that has electrical connector 112. Wires 105A and 105b are electrically connected to piezoelectric sensor 104 and electrical connector 112. The pad of resilient material 102 is placed on the drum head of the acoustic drum so that bottom surface 108 contacts the drum head. As the player strikes top surface 106 with the drum sticks, piezoelectric sensor 104 generates a voltage signal that is routed to electrical connector 112 by wires 105A and 105B. However, the pad of resilient material 102 substantially reduces or mutes any sounds produced by the acoustic drum as the drummer beats the pad 102 with the drum sticks. In one embodiment, the pad of resilient material 102 is fabricated from rubber. In a further embodiment, a layer of vibration-isolating material (similar to layer 50) is embedded within pad of resilient material 102 and positioned under piezoelectric sensor 104.

Figure 7:
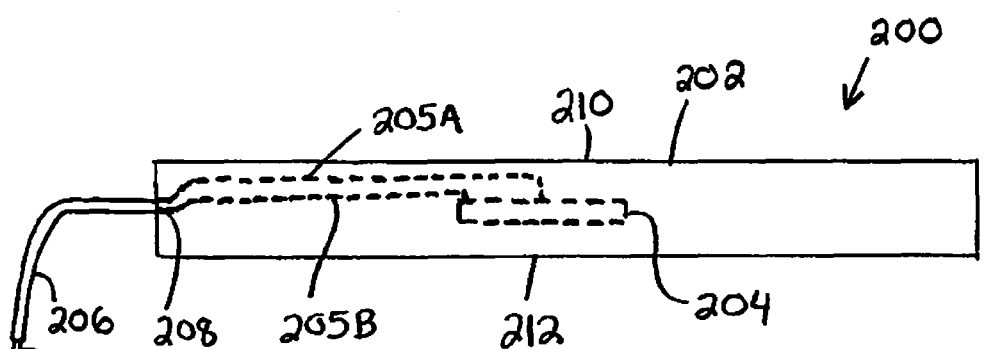
FIG. 7 is a side view of an apparatus for use with an acoustic drum to produce electrical signals while muting the sound of the acoustic drum in accordance with a further embodiment of the present invention.

Referring to FIG. 7, there is shown apparatus 200 in accordance with yet another embodiment of the present invention. Apparatus 200 comprises a pad of resilient material 202 that has embedded therein a piezoelectric sensor 204 and wires 205A and 205B (shown in phantom). Thus, pad of resilient material 202 has generally the same structure as pad 102 of apparatus 100. However, in this embodiment, an electrical connector fixture is not used. Instead, apparatus 200 comprises cable 206 that is electrically connected to wires 205A and 205B. In a preferred embodiment, a portion 208 of cable 206 is embedded within pad of resilient material 202. Cable 206 includes electrical connector 209 that can be connected to external equipment, e.g. modulators, amplifiers, etc. The pad of resilient material 202 has top surface 210 upon which the drummer strikes with the drum sticks, and a bottom surface 212 that is placed on the drum head of the acoustic drum. In one embodiment, the pad of resilient material 202 is fabricated from rubber. In a further embodiment, a layer of vibration-isolating material (similar to layer 50) is embedded within pad of resilient material 202 and positioned under piezoelectric sensor 204.

The principles, preferred embodiments and modes of operation of the present invention have been described in the foregoing specification. The invention which is intended to be protected herein should not, however, be construed as limited to the particular forms disclosed, as these are to be regarded as illustrative rather than restrictive. Variations and changes may be made by those skilled in the art without departing from the spirit of the invention. Accordingly, the foregoing detailed description should be considered as exemplary in nature and not as limiting the scope and spirit of the invention as set forth in the attached claims.

What is claimed is:

1. An electronic percussion apparatus for use with an acoustic drum comprising:
   a layer of material having a bottom side for contacting a drum head of an acoustic drum, and a top side;
   a percussion detector embedded within the layer of material, said percussion detector generating signals upon a percussion impact on the top side of the layer of material;
   said layer of material having a thickness that acoustically isolates the drum head from percussion impacts on said top side of said layer of material, wherein when said electronic percussion apparatus is placed on a drumhead of an acoustic drum and percussion impacts occur on said top side of said layer of material, the drumhead is acoustically isolated from the percussion impacts and said percussion detector generates signals in response to the percussion impacts on said top side of said layer of material.

2. The electronic percussion apparatus according to claim 1 further comprising wires embedded in said layer of material and connected to the percussion detector and a cable having one portion thereof embedded within the layer or material and connected to the wires, the cable having another portion thereof external to the layer of material and adapted to be connected to external equipment.

3. The electronic percussion apparatus according to claim 2 further comprising a layer of vibration-isolating material embedded within said layer of material and positioned under said percussion detector.

4. The electronic percussion apparatus according to claim 1 wherein said layer of material is fabricated from resilient material.

5. The electronic percussion apparatus according to claim 4 wherein said resilient material is rubber.

6. The electronic percussion apparatus according to claim 1 wherein said percussion detector comprises a piezoelectric sensor.

7. The electronic percussion apparatus according to claim 1 wherein said layer of material is substantially circular in shape.

8. The electronic percussion apparatus according to claim 1 further comprising means for routing said signals generated by said percussion detector to external equipment.

* * * * *